United States Patent
Isobe

(10) Patent No.: US 11,342,317 B2
(45) Date of Patent: May 24, 2022

(54) SEMICONDUCTOR APPARATUS AND SEMICONDUCTOR WAFER

(71) Applicant: Canon Kabushiki Kaisha, Tokyo (JP)

(72) Inventor: Mari Isobe, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/032,225

(22) Filed: Sep. 25, 2020

(65) Prior Publication Data

US 2021/0098439 A1    Apr. 1, 2021

(30) Foreign Application Priority Data

Sep. 27, 2019   (JP) .............................. JP2019-177782

(51) Int. Cl.
  *H01L 23/00*  (2006.01)
  *H01L 25/16*  (2006.01)
  *H01L 31/02*  (2006.01)

(52) U.S. Cl.
  CPC ............ *H01L 25/167* (2013.01); *H01L 24/06* (2013.01); *H01L 31/02002* (2013.01); *H01L 2224/06163* (2013.01)

(58) Field of Classification Search
  CPC ... H01L 24/06; H01L 25/0657; H01L 25/167; H01L 25/18; H01L 24/03; H01L 24/80; H01L 2224/06102; H01L 2224/80948; H01L 31/02002; H01L 2224/06163
  USPC ...................................................... 257/777
  See application file for complete search history.

(56) References Cited

U.S. PATENT DOCUMENTS

| | | | |
|---|---|---|---|
| 2006/0146233 A1 | 7/2006 | Park | |
| 2011/0155893 A1 | 6/2011 | Endo | |
| 2012/0256311 A1 | 10/2012 | Takeda | |
| 2013/0105663 A1* | 5/2013 | Endo | H01L 27/14634 250/206 |
| 2013/0112849 A1* | 5/2013 | Shimotsusa | H01L 27/1464 250/206 |
| 2013/0127028 A1 | 5/2013 | Morimoto | |
| 2014/0077391 A1 | 3/2014 | Kikuchi | |
| 2014/0264947 A1* | 9/2014 | Lin | H01L 21/768 257/777 |

(Continued)

FOREIGN PATENT DOCUMENTS

| | | |
|---|---|---|
| JP | 2006191081 A | 7/2006 |
| JP | 2011159916 A | 8/2011 |

(Continued)

*Primary Examiner* — Didarul A Mazumder
(74) *Attorney, Agent, or Firm* — Venable LLP

(57) ABSTRACT

A semiconductor apparatus comprises first and second semiconductor component having first and second metal pads, respectively. The first and second semiconductor components are stacked on each other to be bonded to each other at a bonding face. In a plane including the bonding face, first and second ranges each having a circular contour with a diameter of 10 µm or more are definable. None of bonded portions is provided inside of each of the first and second ranges. At least a part of the bonded portions is located between the first and second ranges. The bonded portions are disposed between the first and second ranges such that any straight line passing through the first and second ranges and parallel to a direction connecting centers of the first and second ranges intersects at least one bonded portion of the bonded portions.

20 Claims, 3 Drawing Sheets

(56) References Cited

U.S. PATENT DOCUMENTS

| | | | |
|---|---|---|---|
| 2015/0340400 A1 | 11/2015 | Takemoto | |
| 2016/0190103 A1* | 6/2016 | Kabe | H01L 24/17 257/777 |
| 2018/0040660 A1 | 2/2018 | Kondo | |
| 2019/0252443 A1* | 8/2019 | Kobayashi | H04N 5/379 |

FOREIGN PATENT DOCUMENTS

| | | |
|---|---|---|
| JP | 2012256736 A | 12/2012 |
| JP | 2016157844 A | 9/2016 |
| JP | 2018160589 A | 10/2018 |

\* cited by examiner

SEMICONDUCTOR APPARATUS AND SEMICONDUCTOR WAFER

BACKGROUND OF THE INVENTION

Field of the Invention

The present disclosure relates to a semiconductor apparatus and a semiconductor wafer.

Description of the Related Art

Japanese Patent Laid-Open No. 2006-191081 describes forming a semiconductor apparatus having a three dimensional structure by stacking two semiconductor components including an element and a wiring structure. In this semiconductor apparatus, an electrode is formed in a bonding face of each of two semiconductor components, and elements of the two semiconductor components are electrically connected by bonding the electrodes to each other. In Japanese Patent Laid-Open No. 2012-256736, it is described that, to increase bonding strength between two semiconductor components, a dummy electrode is formed in a bonding face of each of the semiconductor components, and the dummy electrodes are bonded to each other.

The bonding face of the semiconductor component includes a region where an opening for exposing a bonding pad or an alignment mark in the semiconductor component is formed. In such a region, a metal pad such as a dummy electrode and other electrodes cannot be disposed. An insulating film in a region where the metal pad is not disposed is thicker than an insulating film in a region where the metal pad is formed. When the two semiconductor components in this state are overlapped and bonded, extra force is applied to the semiconductor components, and causes cracking of the semiconductor components. In particular, when two regions in which the metal pads are not disposed are located in a direction parallel to a cleavage plane of the semiconductor component, force is applied to the semiconductor component along this direction, and the semiconductor component is more likely to crack.

SUMMARY OF THE INVENTION

Some aspects of the present disclosure provide a technique for improving the strength of a semiconductor apparatus in which two semiconductor components are stacked.

According to an embodiment, a semiconductor apparatus is provided, the apparatus comprising: a first semiconductor component in which a plurality of first metal pads are disposed; and second semiconductor component in which a plurality of second metal pads are disposed, wherein the first semiconductor component and the second semiconductor component are stacked on each other to be bonded to each other at a bonding face, a plurality of bonded portions are disposed in the bonding face, each of the plurality of first metal pads and each of the plurality of second metal pads being bonded to each other in each of the plurality of bonded portions, in a plane including the bonding face, a first range having a circular contour with a diameter of 10 µm or more and a second range having a circular contour with a diameter of 10 µm or more are definable, none of the plurality of bonded portions is provided inside of each of the first range and the second range, at least a part of the plurality of bonded portions is located between the first range and the second range, and the plurality of bonded portions are disposed between the first range and the second range such that any straight line passing through the first range and the second range and parallel to a direction connecting a center of the first range and a center of the second range intersects at least one bonded portion of the plurality of bonded portions.

Further features of the present disclosure will become apparent from the following description of exemplary embodiments (with reference to the attached drawings).

DESCRIPTION OF THE EMBODIMENTS

Hereinafter, embodiments will be described in detail by referring to the accompanying drawings. Note that the following embodiments do not limit the scope of the invention according to the claims. Although a plurality of features are described in the embodiments, some of the plurality of features may not be essential to the invention, and the plurality of features may be arbitrarily combined. Further, in the accompanying drawings, identical or similar components are denoted by identical reference signs, and redundant description will be omitted.

Figure 1A:
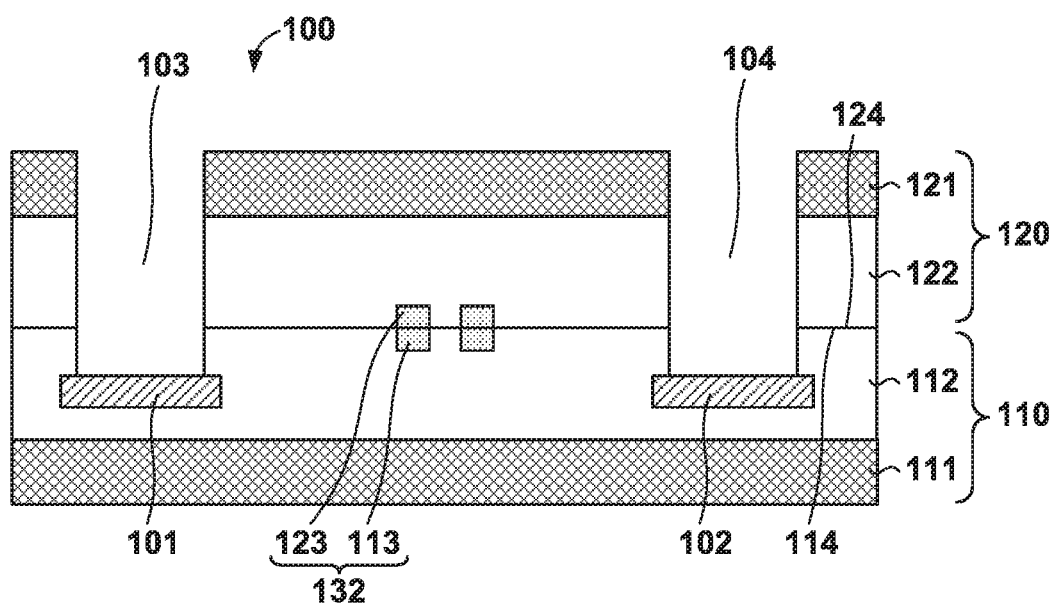
FIGS. 1A and 1B are schematic diagrams illustrating a structure example of a semiconductor apparatus according to an embodiment of the present disclosure.

A structure example of a semiconductor apparatus 100 according to some embodiments of the present disclosure will be described by referring to FIGS. 1A and 1B. FIG. 1A illustrates a cross section of the semiconductor apparatus 100.

Figure 1B:
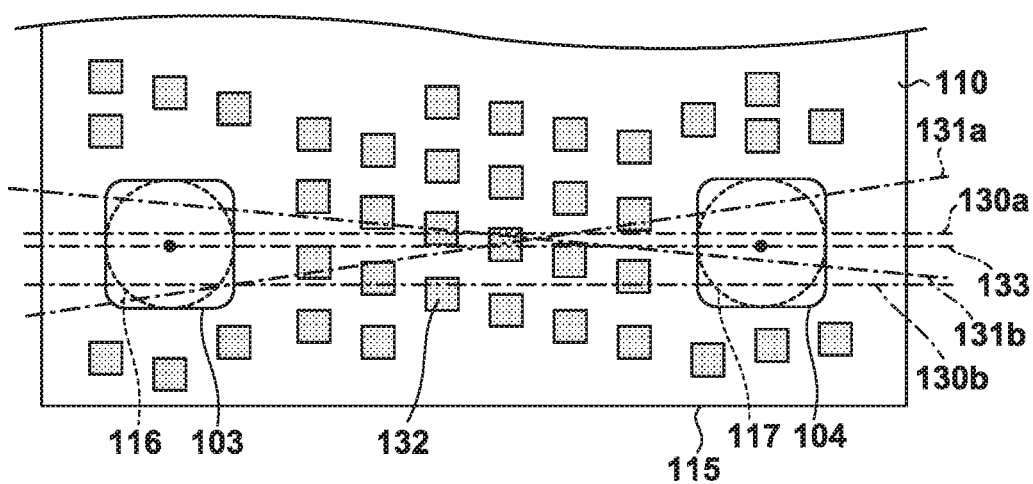

FIG. 1B illustrates a face of the semiconductor component 110 on the semiconductor component 120 side. The semiconductor apparatus 100 includes a semiconductor component 110 and a semiconductor component 120. The semiconductor component 110 and the semiconductor component 120 are bonded to each other in a state where the semiconductor component 110 and the semiconductor component 120 are stacked. A face of the semiconductor component 110 on the semiconductor component 120 side is referred to as a bonding face 114. A face of the semiconductor component 120 on the semiconductor component 110 side is referred to as a bonding face 124.

The semiconductor component 110 includes a semiconductor layer 111 and an insulating film 112 covering one face of the semiconductor layer 111. The semiconductor layer 111 is formed of, for instance, a semiconductor such as a silicon. The insulating film 112 is formed of, for instance, an insulator such as a silicon compound. The insulating film 112 may be a multi-layered film, and for instance, may be a multi-layered film including at least two silicon compound layers among three silicon compound layers of a silicon oxide layer, a silicon nitride layer, and a silicon carbide layer. A circuit element and a wiring member (both not illustrated) are formed in the semiconductor component 110. Since the circuit element and the wiring structure may include an existing configuration, the description of the circuit element and the wiring structure will be omitted.

When the semiconductor apparatus 100 is a photoelectric conversion apparatus, a photoelectric conversion unit may be provided in the semiconductor component 110.

A face of the insulating film 112 farther from the semiconductor layer 111 serves as the bonding face 114 of the semiconductor component 110. A plurality of metal pads 113 are disposed in the bonding face 114. In FIG. 1A, only one metal pad 113 is denoted by a reference sign, but in the semiconductor component 110, all of the members with the same hatching are the metal pads 113. The metal pad is formed in an opening formed in the bonding face 114 of the insulating film 112. The semiconductor component 110 further includes bonding pads 101 and 102 in the insulating film 112.

The semiconductor component 120 includes a semiconductor layer 121 and an insulating film 122 covering one face of the semiconductor layer 121. The semiconductor layer 121 is formed of, for instance, a semiconductor such as a silicon. The insulating film 122 is formed of, for instance, an insulator such as a silicon compound. The insulating film 122 may be a multi-layered film, and for instance, may be a multi-layered film including at least two silicon compound layers among three silicon compound layers of a silicon oxide layer, a silicon nitride layer, and a silicon carbide layer. A circuit element and a wiring structure (both not illustrated) are formed in the semiconductor component 120. Since the circuit element and the wiring structure may include an existing configuration, the description of the circuit element and the wiring structure will be omitted. When the semiconductor apparatus 100 is a photoelectric conversion apparatus, the semiconductor component 120 may be provided with a signal processing unit that processes a signal based upon an electric charge of the above-described photoelectric conversion unit.

A face of the insulating film 122 farther from the semiconductor layer 121 serves as the bonding face 124 of the semiconductor component 120. A plurality of metal pads 123 are disposed in the bonding face 124. In FIG. 1A, only one metal pad 123 is denoted by a reference sign, but in the semiconductor component 120, all of the members with the same hatching are the metal pads 123. The metal pad is formed in an opening formed in the bonding face 124 of the insulating film 122.

The semiconductor component 110 and the semiconductor component 120 are stacked to be bonded to each other at a bonding face. In this state where the semiconductor component 110 and the semiconductor component 120 are stacked, the bonding face 114 and the bonding face 124 are an identical face. Therefore, the following description of the bonding face 114 is also applicable analogously to the bonding face 124. A plurality of bonded portions 132 are disposed in the bonding face 114, and in each of the plurality of bonded portions 132, each of the plurality of first metal pads 113 and each of the plurality of metal pads 123 are bonded to each other. The plurality of metal pads 113 and the plurality of metal pads 123 may have a one-to-one correspondence. Alternatively, the metal pads 113 that are not bonded to metal pads 123 may be present, and the metal pads 123 that are not bonded to metal pads 113 may be present. In the following description, for the sake of simplicity, it is assumed that the plurality of metal pads 113 and the plurality of metal pads 123 have a one-to-one correspondence, and all of the pairs form bonded portions. That is, the metal pads 113 and the bonded portions 132 have a one-to-one correspondence, and the metal pads 123 and the bonded portions 132 have a one-to-one correspondence.

The plurality of bonded portions 132 may include normal bonded portions and dummy bonded portions. The normal bonded portion refers to a bonded portion used for power supply or signal transmission. The normal bonded portion may be electrically connected to the circuit element or the wiring member in the semiconductor component 110 and to the circuit element or the wiring member in the semiconductor component 120. The dummy bonded portion refers to a metal pad that is not used for either power supply or signal transmission. The dummy bonded portion may not be electrically connected to the circuit element or the wiring member in the semiconductor component 110 and the circuit element or the wiring member in the semiconductor component 120.

A shape of one bonded portion 132 in the bonding face 114 will be described. The bonded portion 132 may have a shape falling within the range having a circular contour with a diameter of 10 μm. For instance, the bonded portion 132 may have a square contour with one side of 7 μm or less. Further, the bonded portion 132 may have a shape falling within the range having a circular contour with a diameter of 7 μm. For instance, the bonded portion 132 may have a square contour with one side of 5 μm or less. Further, the bonded portion 132 may have a shape falling within the range having a circular contour with a diameter of 5 μm. For instance, the bonded portion 132 may have a square contour with one side of 3.5 μm or less. In addition, the bonded portion 132 may have a shape that does not fall within the range having a circular contour with a diameter of 1 μm. For instance, the bonded portion 132 may have a square contour with one side of 0.7 μm or more. More specifically, the bonded portion 132 may have a square contour having one side of 1 μm or more and 5 μm or less (for instance, 3 μm). The shape of the bonded portion 132 may be the same as a shape of the metal pad 113 and a shape of the metal pad 123.

In the semiconductor apparatus 100, an opening 103 for exposing the bonding pad 101 and an opening 104 for exposing the bonding pad 102 are formed from the semiconductor layer 121 side of the semiconductor component 120. Bonding wires (not illustrated) are connected to the bonding pads 101 and 102 through the openings 103 and 104. The opening 103 may have a shape including a circle having a diameter of 10 μm in the bonding face 114. This shape may be, for instance, a square having one side of 10 μm. Further, the opening 103 may have a shape including a circle having a diameter of 50 μm in the bonding face 114. This shape may be, for instance, a square having one side of 50 μm. Further, the opening 103 may have a shape that falls within a circle having a diameter of 150 μm in the bonding face 114. This shape may be, for instance, a square having one side of 106 μm.

By referring to FIG. 1B, how the plurality of bonded portions 132 are disposed in the bonding face 114 of the semiconductor component 110 will be described. The plurality of bonded portions 132 are disposed such that two ranges 116 and 117 are definable in a plane including the bonding face 114. The range 116 and the range 117 each have a circular contour with a diameter of 10 μm or more. The contour of the range 116 and the contour of the range 117 may each be a circle having a diameter of 100 μm or less. For instance, the contour of the range 116 and the contour of the range 117 may each be a circle having a diameter of 50 μm. The contour of the range 116 and the contour of the range 117 may or may not be congruent with each other. That is, when both the contours are circles, the diameters of these circles may or may not be equal. In the following, the description for the range 116 is also applicable analogously to the range 117, unless stated otherwise. Therefore, redundant description of the range 117 will be omitted.

The range 116 does not include any of the plurality of bonded portions 132 inside. Here, "not include any of the plurality of bonded portions 132 inside" means not including one bonded portion 132 entirely, and also means not including a part of one bonded portion 132. That is, the range 116 does not intersect the bonded portion 132 disposed in the bonding face 114. The range 116 is entirely located within the opening 103. The range 117 is entirely located within the opening 104. In the bonding face 114, a contour of the opening 103 may be a shape in which at least three points of the contour of the range 116 are inscribed. In the bonding face 114, a contour of the opening 104 may be a shape in which at least three points of the contour of the range 117 are inscribed. The ranges 116 and 117 and the openings 103 and 104 are not limited to overlapping. For instance, in the bonding face 114, an alignment mark may be formed inside of at least one of the two ranges 116 and 117. Alternatively, the inside of at least one of the two ranges 116 and 117 may not include a characteristic configuration and may simply be the face of the insulating film 112. For instance, the two ranges 116 and 117 may entirely be formed of bonded portions between the insulating film 112 and the insulating film 122.

At least a part of the plurality of bonded portions 132 is located between the range 116 and the range 117. "Between the range 116 and the range 117" refers to a region surrounded by a first common circumscribing line circumscribing the range 116 and the range 117, a second common circumscribing line circumscribing the range 116 and the range 117, the range 116, and the range 117. The common circumscribing line refers to a tangent in a case where two circles (the range 116 and the range 117) are on the same side of the tangent. The tangent in a case where the two circles (the range 116 and the range 117) are on opposite sides of the tangent is the common inscribing line and is distinguished from the common circumscribing line. Between the range 116 and the range 117, the first common circumscribing line and the second common circumscribing line do not intersect each other. When the range 116 and the range 117 are congruent, the first common circumscribing line and the second common circumscribing line may be parallel. A direction connecting the centers of the ranges 116 and 117 is referred to as a direction 133. The plurality of bonded portions 132 are disposed between a plurality of the ranges 116 and a plurality of the ranges 117 such that any straight line passing through the plurality of ranges 116 and the plurality of ranges 117 and parallel to the direction 133 intersects at least one bonded portion 132 among the plurality of bonded portions 132. "Any straight line" means all straight lines satisfying this condition. The same applies to the following "any straight line." For instance, a straight line 130a passing through the two ranges 116 and 117 and parallel to the direction 133 intersects two bonded portions 132 among the plurality of bonded portions 132. Another straight line 130b passing through the two ranges 116 and 117 and parallel to the direction 133 intersects three bonded portions 132 among the plurality of bonded portions 132. Thus, the straight lines 130a and 130b passing through the two ranges 116 and 117 and parallel to the direction 133 may intersect at least two bonded portions 132 among the plurality of bonded portions 132. In the present specification, the two directions being parallel to each other indicates that an angle formed by the two directions is 0 degree. However, as an embodiment, this may be a concept including an error, and for instance, an angle formed by the two directions along each other may be 5 degrees or less. The direction 133 may be a direction along one side 115 of the bonding face 114 or may be a direction parallel to the one side 115 of the bonding face 114. The straight lines 130a and 130b may extend in a direction along the one side 115 of the bonding face 114 or may extend in a direction parallel to the one side 115 of the bonding face 114.

Effects of the arrangement of the above-described bonded portions 132 will be described. As a comparative example, a case where a plurality of bonded portions 132 are disposed in an array will be examined. Generally, as described below, the semiconductor component 110 is formed by dicing a semiconductor wafer along a cleavage plane. Therefore, since the direction parallel to the side 115 of an end face of the semiconductor component 110 coincides with the direction parallel to the cleavage plane of the semiconductor component 110, the semiconductor component 110 is likely to crack along this direction. When the plurality of bonded portions 132 are disposed in an array, a straight line passing through the two ranges 116 and 117 and parallel to the one side 115 of the bonding face 114 without intersecting any of the plurality of bonded portions 132 is present. Since a portion where the insulating film 112 becomes thick continues along such a straight line, the semiconductor component 110 is likely to crack at this portion. In particular, since the film thickness of the insulating film 112 is large before the formation of the openings 103 and 104 in regions where the bonded portions 132 are not disposed (the inside of the ranges 116 and 117), the semiconductor component 110 is likely to crack in a portion between these two regions. On the other hand, in the arrangement of the bonded portions 132 illustrated in FIG. 1B, any straight line passing through the two ranges 116 and 117 and parallel to the direction 133 intersects any of the plurality of bonded portions 132. Therefore, the semiconductor component 110 is less likely to crack, and as a result, the strength of the semiconductor apparatus 100 is improved.

In the above-described example, any straight line passing through the two ranges 116 and 117 and parallel to the direction 133 intersects any of the plurality of bonded portions 132. In addition, the plurality of bonded portions 132 may be disposed such that any straight line (for instance, a straight line 131a or a straight line 131b) passing through the two ranges 116 and 117 intersects any of the plurality of bonded portions 132. Accordingly, the semiconductor component 110 is less likely to crack not only in the direction parallel to the direction 133 but also in other directions.

The plurality of bonded portions 132 may be distributed evenly or may be distributed unevenly. For instance, the bonded portions 132 may be disposed densely on a straight line connecting the centers of the two ranges 116 and 117, and the plurality of bonded portions 132 may be disposed such that the density of the bonded portions 132 decreases as the distance from the straight line increases.

The distance between the centers of the two ranges 116 and 117 may be, for instance, 10 µm or more such that the sufficient number of bonded portions 132 are disposed between the two ranges 116 and 117. The distance between the centers of the two ranges 116 and 117 may be, for instance, 1000 µm or less. Accordingly, the distance between the centers of the two ranges 116 and 117 may be 10 µm or more and 1000 µm or less.

The arrangement of the bonded portions 132 is described above. Since the bonded portions 132 are each formed of the metal pad 113 and the metal pad 123, the metal pad 113 and the metal pad 123 are disposed as with the bonded portion 132.

Figure 2A:
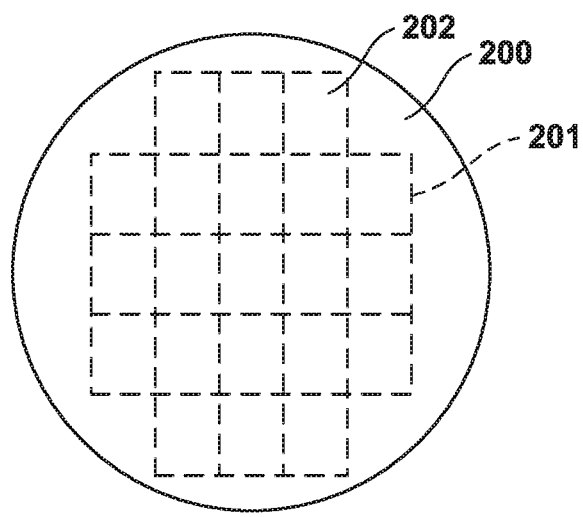
FIGS. 2A and 2B are schematic diagrams illustrating a structure example of a semiconductor wafer according to an embodiment of the present disclosure.
Figure 2B:
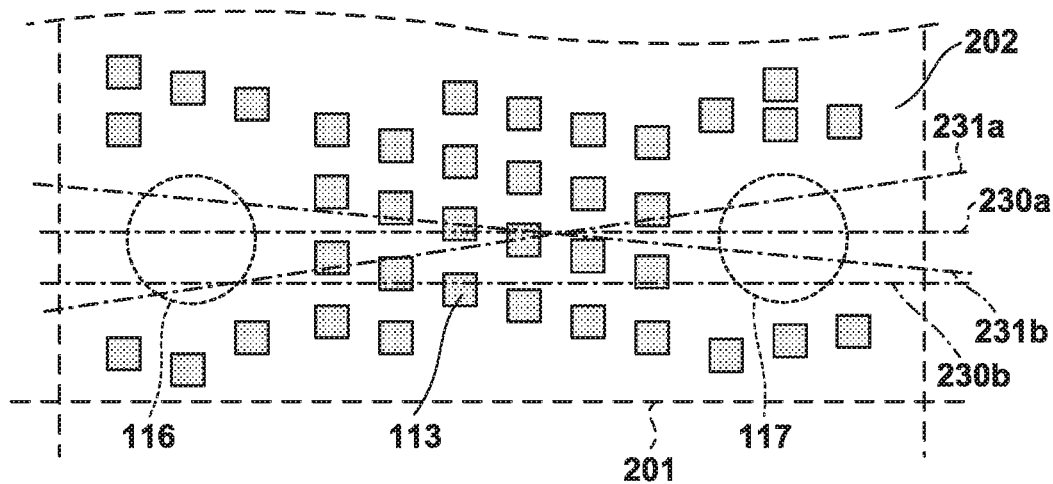

By referring to FIGS. 2A and 2B, a structure example of a semiconductor wafer 200 according to some embodiments of the present disclosure will be described. FIG. 2A illustrates a plan view of a semiconductor wafer 200. FIG. 2B illustrates a part of the semiconductor wafer 200. The semiconductor wafer 200 is divided into a plurality of sections 202, and a circuit arrangement for configuring the semiconductor component 110 is formed in each section 202. Although not illustrated, other semiconductor wafer different from the semiconductor wafer 200 is divided into a plurality of sections corresponding to the plurality of sections 202, and a circuit arrangement for configuring the semiconductor component 120 is formed in each section. The metal pad 113 of the semiconductor wafer 200 and the metal pad 123 of the other semiconductor wafer are bonded to form a bonded portion 132. Accordingly, a stacked body in which the semiconductor wafer 200 including the semiconductor component 110 and the other semiconductor wafer including the semiconductor component 120 are bonded and stacked is formed.

Subsequently, the other semiconductor wafer is etched above the bonding pads 101 and 102, and the insulating film 112 is etched above the bonding pads 101 and 102 of the semiconductor wafer 200 to form the openings 103 and 104. In the etching for forming the openings 103 and 104, to prevent contamination of an etching apparatus, the openings 103 and 104 are formed to pass through regions in the bonding face 114 where the metal pads are not disposed (the ranges 116 and 117). Further, the stacked body of the semiconductor wafers in which the openings 103 and 104 are formed are diced along a scribe line 201. Accordingly, a plurality of the semiconductor apparatuses 100 each including the semiconductor components 110 and 120 are formed.

By referring to FIG. 2B, the section 202 for forming the semiconductor component 110 will be described. The plurality of metal pads 113 are disposed in one section 202. Since the arrangement of the metal pads 113 in the semiconductor wafer 200 is the same as the arrangement of the metal pads 113 in the semiconductor component 110, only the differences will be described below, and redundant description will be omitted.

Since the openings 103 and 104 are not yet formed in the semiconductor wafer 200, the ranges 116 and 117 are circular regions in the plane of the semiconductor wafer 200. No metal pad is disposed in the circular regions.

Any straight line passing through the two ranges 116 and 117 and parallel to an end face of the semiconductor wafer 200 intersects any of the plurality of metal pads 113. For instance, a straight line 230a passing through the two ranges 116 and 117 and parallel to the one side 115 of the bonding face 114 intersects two metal pads 113 among the plurality of metal pads 113. A straight line 230b passing through the two ranges 116 and 117 and parallel to the one side 115 of the bonding face 114 intersects three metal pads 113 among the plurality of metal pads 113. In addition, the plurality of metal pads 113 may be disposed such that any straight line (for instance, a straight line 231a or a straight line 231b) intersecting the two ranges 116 and 117 intersects any of the plurality of metal pads 113.

For instance, when the semiconductor wafer 200 is a silicon wafer, the cleavage plane is (110) or (111) by using the Miller index. In general, the scribe line 201 is set to be parallel to the cleavage plane of the semiconductor wafer 200. Therefore, the side 115 of the end face of the semiconductor component 110 is parallel to the cleavage plane of the semiconductor wafer 200.

Figure 3:
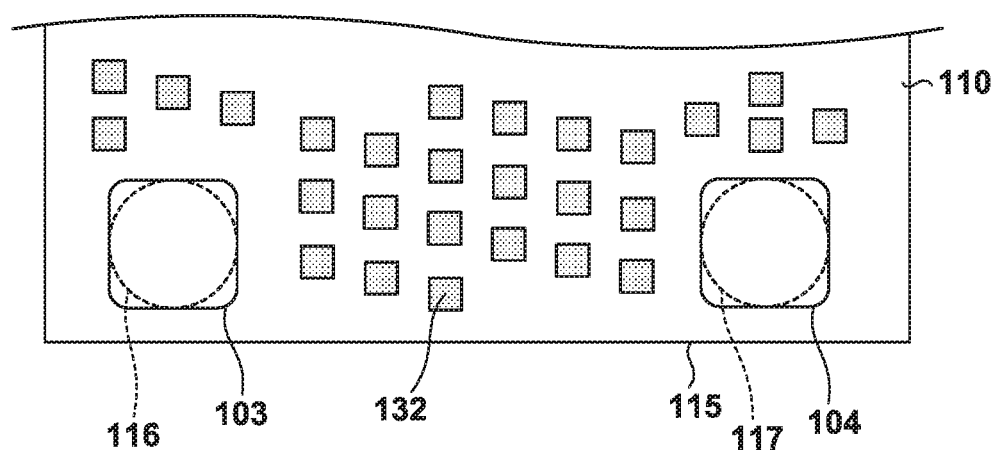
FIG. 3 is a schematic diagram illustrating a modification of a semiconductor apparatus according to an embodiment of the present disclosure.

A modification of the semiconductor apparatus 100 will be described by referring to FIG. 3. In the example of FIG. 1B, the semiconductor component 110 includes a part of the plurality of bonded portions 132 between the two ranges 116 and 117 and the side 115 in the direction orthogonal to the side 115 of the bonding face 114. In the present specification, that "two directions are orthogonal" indicates that an angle formed by the two directions is 90 degrees, but as an embodiment, this may be a concept including an error, and for instance, the angle formed by the two directions intersecting each other may be 85 degree or more and 90 degrees or less. Alternatively, in the example of FIG. 3, the semiconductor component 110 does not include a part of the plurality of bonded portions 132 between the two ranges 116 and 117 and the side 115 in the direction orthogonal to the side 115 of the bonding face 114. Accordingly, the two ranges 116 and 117 can be defined near the side 115 of the bonding face 114. Accordingly, the finish of dicing of the semiconductor wafer for forming the side 115 can be improved. Note that although the example in which dicing is performed after the semiconductor wafers are bonded is described here, the semiconductor apparatus 100 can also be manufactured by dicing the semiconductor wafers to obtain semiconductor chips, and then bonding the semiconductor chips to each other.

Figure 4:
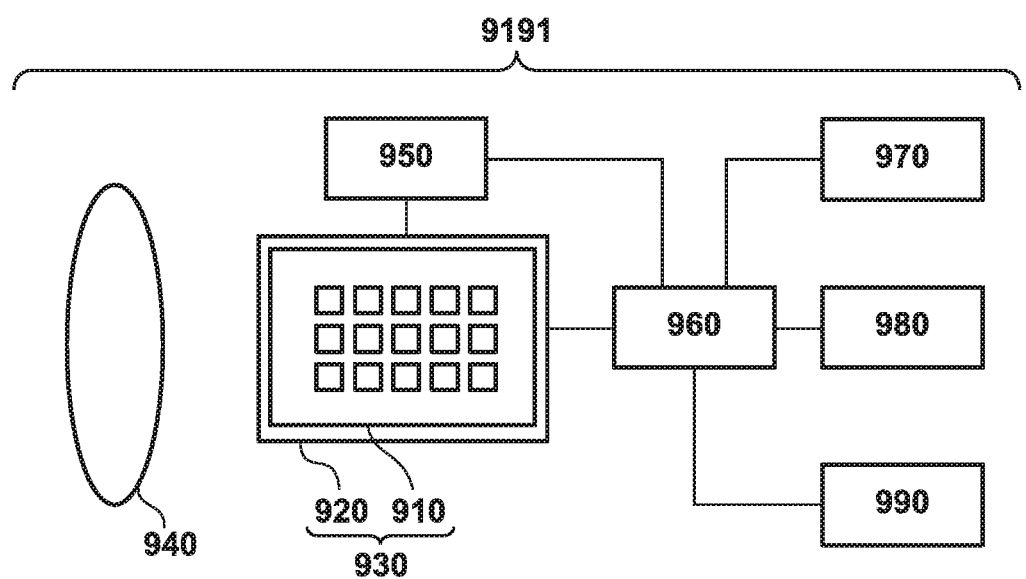
FIG. 4 is a schematic diagram illustrating equipment according to an embodiment of the present disclosure.

Hereinafter, equipment 9191 including a semiconductor apparatus 930 illustrated in FIG. 4 will be described in detail. The semiconductor apparatus 930 may be the semiconductor apparatus 100 described above. The semiconductor apparatus 930 can include a semiconductor device 910 and a package 920 housing the semiconductor device 910. The package 920 can include a base to which the semiconductor device 910 is fixed and a lid such as glass that faces the semiconductor device 910. The package 920 can further include a bonding member such as a bonding wire or a bump for connecting a terminal provided in the base and a terminal (bonding pads 101 and 102) provided in the semiconductor device 910.

The equipment 9191 can include at least one of an optical apparatus 940, a control apparatus 950, a processing apparatus 960, a display apparatus 970, a storage apparatus 980, and a mechanical apparatus 990. The optical apparatus 940 includes, for instance, a lens, a shutter, or a mirror. The control apparatus 950 controls the semiconductor apparatus 930. The control apparatus 950 is a semiconductor apparatus such as an ASIC.

The processing apparatus 960 processes a signal output from the semiconductor apparatus 930. The processing apparatus 960 is a semiconductor apparatus such as a CPU or an ASIC for configuring an AFE (analog front end) or a DFE (digital front end). The display apparatus 970 is an EL display apparatus or a liquid crystal display apparatus which displays information (image) obtained by the semiconductor apparatus 930. The storage apparatus 980 is a magnetic device or a semiconductor device that stores information (image) obtained by the semiconductor apparatus 930. The storage apparatus 980 is a volatile memory such as an SRAM or a DRAM, or a nonvolatile memory such as a flash memory or a hard disk drive.

The mechanical apparatus 990 includes a movable portion or a propulsion portion such as a motor or an engine. In the equipment 9191, a signal output from the semiconductor apparatus 930 is displayed on the display apparatus 970 or transmitted to the outside by a communication apparatus (not illustrated) provided in the equipment 9191. Therefore, the equipment 9191 may further include the storage apparatus 980 and the processing apparatus 960 in addition to a memory circuit and an arithmetic circuit provided in the semiconductor apparatus 930. The mechanical apparatus 990 may be controlled based upon a signal output from the semiconductor apparatus 930.

In addition, the equipment 9191 is suitable for electronic equipment such as an information terminal (for instance, a smartphone or a wearable terminal) or a camera (for instance, an interchangeable-lens camera, a compact camera, a video camera, or a monitoring camera) including an imaging function. The mechanical apparatus 990 in the camera can drive components of the optical apparatus 940 for zooming, focusing, and shuttering operations. Alternatively, the mechanical apparatus 990 in the camera can move the semiconductor apparatus 930 for image stabilization operation.

In addition, the equipment 9191 may be transportation equipment such as a vehicle, a ship, or a flying object. The mechanical apparatus 990 in the transportation equipment may be used as a driving apparatus. The equipment 9191 as the transportation equipment may transport the semiconductor apparatus 930 or may assist and/or automate driving (maneuvering) by an imaging function. The processing apparatus 960 for assisting and/or automating driving (maneuvering) can perform processing for operating the mechanical apparatus 990 as a driving apparatus based upon information obtained by the semiconductor apparatus 930. Alternatively, the equipment 9191 may be medical equipment such as an endoscope, measurement equipment such as an analysis and ranging sensor, analysis equipment such as an electron microscope, or office equipment such as a copying machine.

The embodiments described above can be modified appropriately in a scope that does not depart from the technical concept. Note that the disclosure of the present specification includes not only what is described in the present specification but also all matters that can be understood from the present specification and the drawings attached to the present specification. In addition, the disclosure contents of the present specification also include a complementary set of the concepts described in the present specification. That is, in the present specification, for instance, when there is the description "A is B," it can be said that the present specification discloses that "A is not B" even when the description "A is not B" is omitted. This is because when it is described that "A is B," it is assumed that the case where "A is B" is considered.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-177782, filed Sep. 27, 2019, which is hereby incorporated by reference herein in its entirety.

What is claimed is:

1. A semiconductor apparatus, comprising:
a first semiconductor component in which a plurality of first metal pads are disposed; and
a second semiconductor component in which a plurality of second metal pads are disposed, wherein
the first semiconductor component and the second semiconductor component are stacked on each other to be bonded to each other at a bonding face,
a plurality of bonded portions are disposed in the bonding face, each of the plurality of first metal pads and each of the plurality of second metal pads being bonded to each other in each of the plurality of bonded portions,
in a plane including the bonding face, a first range having a circular contour with a diameter of 10 μm or more and a second range having a circular contour with a diameter of 10 μm or more are definable,
none of the plurality of bonded portions is provided inside of each of the first range and the second range,
at least a part of the plurality of bonded portions is located between the first range and the second range, and
the plurality of bonded portions are disposed between the first range and the second range, wherein any straight line passing through the first range and the second range and parallel to a direction connecting a center of the first range and a center of the second range intersects at least one bonded portion of the plurality of bonded portions in a plan view.

2. The semiconductor apparatus according to claim 1, wherein at least one of the plurality of bonded portions is used for neither power supply nor for signal transmission.

3. The semiconductor apparatus according to claim 1, wherein each of the circular contour of the first range and the circular contour of the second range is a circle having a diameter of 100 μm or less.

4. The semiconductor apparatus according to claim 1, wherein the circular contour of the first range and the circular contour of the second range are congruent with each other.

5. The semiconductor apparatus according to claim 1, wherein the at least one bonded portion of the plurality of bonded portions has a shape that falls within a range having a circular contour with a diameter of 10 μm.

6. The semiconductor apparatus according to claim 5, wherein the at least one bonded portion of the plurality of bonded portions has a shape that does not fall within a range having a circular contour with a diameter of 1 μm.

7. The semiconductor apparatus according to claim 1, wherein a distance between the centers of the first range and the second range is 10 μm or more and 1000 μm or less.

8. The semiconductor apparatus according to claim 1, wherein the direction connecting the center of the first range and the center of the second range is along one side of the bonding face.

9. The semiconductor apparatus according to claim 8, wherein the first semiconductor component includes a part of the plurality of first metal pads between the first range and the one side and between the second range and the one side in a direction orthogonal to the one side.

10. The semiconductor apparatus according to claim 8, wherein the first semiconductor component includes no metal pad between the first range and the one side and between the second range and the one side in a direction orthogonal to the one side.

11. The semiconductor apparatus according to claim 1, wherein the any straight line passing through the first range and the second range and parallel to the direction intersects at least two of the plurality of bonded portions.

12. The semiconductor apparatus according to claim 1, wherein between the first range and the second range, the any straight line passing through the first range and the second range intersects at least one of the plurality of bonded portions.

13. The semiconductor apparatus according to claim 1, wherein the first semiconductor component includes a first bonding pad and a second bonding pad, a first opening for exposing the first bonding pad and a second opening for exposing the second bonding pad are formed in the second semiconductor component, and the first range is entirely located in the first opening, and the second range is entirely located in the second opening.

14. The semiconductor apparatus according to claim 1, wherein each of the circular contour of the first range and the circular contour of the second range is a circle having a diameter of 50 μm.

15. The semiconductor apparatus according to claim 1, wherein the first semiconductor component comprises a photoelectric conversion unit, and the second semiconductor component comprises a signal processing unit configured to process a signal based upon an electric charge of the photoelectric conversion unit.

16. An equipment comprising:

the semiconductor apparatus according to claim 1; and at least one of six apparatuses of:

an optical apparatus corresponding to the semiconductor apparatus;

a control apparatus configured to control the semiconductor apparatus;

a processing apparatus configured to process information obtained from the semiconductor apparatus;

a display apparatus configured to display information obtained from the semiconductor apparatus;

a storage apparatus configured to store information obtained from the semiconductor apparatus; and a mechanical apparatus configured to operate based upon information obtained from the semiconductor apparatus.

17. A semiconductor wafer comprising:

a face in which a plurality of metal pads are disposed, wherein a first range having a circular contour with a diameter of 10 μm or more and a second range having a circular contour with a diameter of 10 μm or more are definable in a plane including the face, none of the plurality of metal pads is provided inside of each of the first range and the second range;

at least a part of the plurality of metal pads is located between the first range and the second range; and the plurality of metal pads are disposed between the first range and the second range, wherein any straight line passing through the first range and the second range and parallel to an end face of the semiconductor wafer intersects at least one metal pad of the plurality of metal pads in a plan view.

18. The semiconductor wafer according to claim 17, wherein each of the circular contour of the first range and the circular contour of the second range is a circle having a diameter of 100 μm or less.

19. The semiconductor wafer according to claim 17, wherein a distance between centers of the first range and the second range is 10 μm or more and 1000 μm or less.

20. The semiconductor wafer according to claim 17, wherein between the first range and the second range, the any straight line passing through the first range and the second range intersects at least one of the plurality of metal pads.

* * * * *